5/10/83 XR 4,383,194

United States Patent [19]

Ohigashi et al.

[11] 4,383,194

[45] May 10, 1983

[54] ELECTRO-ACOUSTIC TRANSDUCER ELEMENT

[75] Inventors: Hiroji Ohigashi, Zushi; Joshiharu Nakanishi, Kamakura; Miyo Suzuki, Fujisawa, all of Japan

[73] Assignee: Toray Industries, Inc., Tokyo, Japan

[21] Appl. No.: 143,132

[22] Filed: Apr. 23, 1980

[30] Foreign Application Priority Data

May 1, 1979 [JP] Japan .................................. 54/52475
May 25, 1979 [JP] Japan .................................. 54/63789

[51] Int. Cl.[3] .............................................. H01L 41/04

[52] U.S. Cl. .................................... 310/326; 310/321; 310/327; 310/800

[58] Field of Search ................ 310/800, 327, 334–337, 310/326, 325, 321; 367/151, 152, 157, 162, 163

[56] References Cited

U.S. PATENT DOCUMENTS 3,277,435 10/1966 Thompson et al. ................. 367/157
3,798,473 3/1974 Murayama et al. ................. 310/800
3,943,614 3/1976 Yoshikawa et al. ............... 29/25.35
3,969,927 7/1976 Yoshida et al. ....................... 73/71.4
4,166,967 9/1979 Benes et al. ......................... 310/338

FOREIGN PATENT DOCUMENTS 15886 9/1980 European Pat. Off. ........ 179/110 A

*Primary Examiner*—J. D. Miller
*Assistant Examiner*—D. L. Rebsch
*Attorney, Agent, or Firm*—Jenkins, Coffey, Hyland, Badger & Conard

[57] ABSTRACT

Electro-acoustic transducer element having its resonant frequency in a lower frequency range advantageously usable for diagnostic purposes comprises a polymeric piezoelectric film such as polyvinylidene fluoride film being coupled with an additional layer having a thickness specified in relation to the wavelength of sound waves within the additional layer at the free resonant frequency of the polymeric piezoelectric film, the additional layer having an acoustic impedance related to the acoustic impedance of the polymeric piezoelectric film.

14 Claims, 27 Drawing Figures

ELECTRO-ACOUSTIC TRANSDUCER ELEMENT

BACKGROUND OF THE INVENTION

The present invention relates to an improved electro-acoustic transducer element, and more particularly relates to an improvement in or modification of an electro-acoustic transducer element utilizing the vibration mode in the thickness direction of a polymeric piezoelectric film as disclosed in Japanese Patent Publication No. 78/26799 (TOKKOSHO 53-26799). The present electro-acoustic transducer element is used for transmission and/or conversion of ultrasonic waves.

As a substitute for the conventional inorganic piezoelectric material, polymeric piezoelectric material may be advantageously used for ultrasonic vibrators in the field of diagnostics and detection of internal defects in various articles. Advantages are its easy production of large-sized films, easiness in treatment and fine fit to curved surfaces.

The acoustic impedance of a polymeric piezoelectric material is far lower than that of inorganic piezoelectric materials and very close to those of water, organisms and general organic materials. Thus, the polymeric piezoelectric material functions as an excellent transmitter and receiver for ultrasonic waves which travel through these objects.

However, the use of polymeric piezoelectric films in the construction of an ultrasonic transducer is, in practice, accompanied with various problems.

In the case of ultrasonic devices used for diagnostics and/or detection of internal defects, ultrasonic waves are mostly used with frequencies in the range from 1 to 10 MHz.

It is well known that, in order to obtain high transmission efficiency, the resonant frequency of the vibrator has to match the frequency of the ultrasonic wave to be used for the process. In other words, the thickness of the piezoelectric film has to be chosen in accordance with the frequency of the ultrasonic wave to be used for the intended process.

In the case of polyvinylidene fluoride which is a typical polymeric piezoelectric material, its frequency constant (F)×(T) is nearly equal to 115 KHz·cm, (F) being the resonant frequency of a free thickness vibrator and (T) being the thickness of the film. In order to obtain high efficiency in transmission of an ultrasonic wave of 2.5 MHz frequency which is commonly used for diagnostic purposes, it is required for the film to have a thickness of 460 μm (micrometer) for a half wave drive, and 230 μm for a quarter wave drive.

A potential of about $10^6$ V/cm is needed for polarization of polymer to provide for piezoelectricity. Polarization of a polymer film of a large thickness is often accompanied with trouble such as aerial discharge, thereby disabling easy preparation of a thick polymer piezoelectric film. The conventionally available thickness under the present technology is typically 100 μm or smaller. This is the first disadvantage of the conventional art.

In the production of a polymeric piezoelectric film, it is very difficult to optimumly control the process in order to provide the resultant film with a thickness well suited for transmission of the ultrasonic wave of a desired frequency. Such a polymer piezoelectric film is in most cases obtained by polarization of a material film after drawing. Depending on the process conditions in drawing and heat treatment, thickness of the resultant film varies greatly. Quite unlike the inorganic piezoelectric material, it is extremely troublesome and, consequently, almost infeasible to adjust the thickness of a polymer piezoelectric film by means of polishing or griding. This is the second disadvantage of the conventional art.

Dielectric constant of a polymer piezoelectric film is in general not so high as that of the inorganic piezoelectric material such as PZT. Therefore, increase in thickness of the film causes reduction in electric capacity. As a resultant, an increased electric impedance of the vibrator does not well match that of the electric power source, thereby blocking smooth supply of energy to the vibrator from the electric power source. This is the third disadvantage of the prior art.

SUMMARY OF THE INVENTION

It is the basic object of the present invention to provide an electro-acoustic transducer element incorporating a polymeric piezoelectric film of a reduced thickness which enables transmission of ultrasonic waves having frequencies lower than its inherent resonant frequency with reduced transmission loss.

It is another object of the present invention to provide an electro-acoustic transducer element incorporating a polymeric piezoelectric film of an ideal function without any noticeable damage of high flexibility, low acoustic impedance characteristics and easiness in treatment inherent to the polymer piezoelectric material.

In accordance with the basic aspect of the present invention, an electro-acoustic transducer element comprises a polymeric piezoelectric film, elements functioning as electrodes for the film, and an additional layer coupled acoustically to the film. The value of the acoustic impedance (Z) of said additional layer is not less than two times the value of the acoustic impedance ($Z_o$) of said film. The additional layer has a thickness of 0.5 μm through 3λ/8 when said additional layer is located on the acoustic emanation side, and of 0.5 μm up to 1λ/16 when said additional layer is located on the side opposite to the acoustic emanation side λ (lambda) refers to the wavelength of sound waves within said additional layer at the free resonant frequency of said film.

In accordance with a preferred embodiment of the present invention, when said additional layer is located at the acoustic emanation side, the thickness of said additional layer is selected in the range from 0.5 μm to 1λ/4 and more preferably in the range from 1 μm to 1λ/8.

In accordance with another preferred embodiment of the present invention, when said additional layer is located at the side opposite to the acoustic emanation side, the thickness of said additional layer is selected in the range from 1 μm to 1λ/16.

The additional layer may be either directly or indirectly coupled acoustically to the polymeric piezoelectric film.

When the additional layer is made of electro-conductive material, the electrode on the side to which the additional layer is coupled may be omitted and in that case, the additional layer may function as an electrode as well as an additional layer.

Any polymer film having piezoelectricity in the thickness direction as a result of polarization is usable for the present invention. Such a film can be made of a polymeric material preferably chosen from the group consisting of polyvinylidene fluoride; copolymers of polyvinylidene fluoride such as copolymers of vinylidene fluoride with tetrafluoroethylene, trifluoroethylene, hexafluoroethylene or vinylidene chloride; polyvinyl chloride; acrylonitrile polymers or polymers including powder of ferroelectric ceramic such as lead zirconate-titanate powder. For example, a piezoelectric polyvinylidene fluoride film is disclosed in U.S. Pat. No. 3,931,446, and piezoelectric copolymers of polyvinylidene fluoride films are disclosed in British Pat. No. 1,349,860.

The term "acoustic emanation side" refers to one of the two surface sides of a polymeric piezoelectric film which faces an acoustic transmission medium through which the ultrasonic waves of a desired frequency travel away from or towards the polymeric piezoelectric film.

In the following description, this acoustic emanation side of the film may be referred to as "the front side" whereas the other side of the film opposite to this acoustic emanation side may be referred to as "the rear side".

In accordance with the present invention, an additional layer is either directly or indirectly coupled acoustically, on either of the front and rear sides, of a polymeric piezoelectric film may be placed either in a direct surface contact with the piezoelectric film or in an indirect surface association with the piezoelectric film via any intervening layer such as an electrode. The additional layer may hereinafter referred to as "the front additional layer" or "the rear additional layer".

The additional layer is preferably formed with metal such as Al, Cu, Ag, Sn, Au, Pb, Ni, Ti, Cr, Fe, Zn, In, Mo, and alloys whose constituents include at least one of said metals; ceramic; glass; or polymeric material including a powder of metal or ceramic.

In order to assemble the polymeric piezoelectric film with the additional layer in an acoustically integral fashion, the material for the additional layer is first shaped into a film which is next bonded to the polymeric piezoelectric film. It is also possible to coat one surface of the piezoelectric film or one surface of an intervening layer which is in contact with the polymeric piezoelectric film with the material to form the additional layer. The coating may be achieved by appropriate vaporization, painting or plating.

In this specification, the effect of the present invention is evaluated in terms of the conversion loss (TLf) of a electro-acoustic transducer element. The coversion loss (TLf) is defined as follows;

$$\text{Conversion Loss } (TLf) = -10 \cdot \log (PAf/Pt)$$

where Pt is the effective electric power delivered into a transducer element from an electric source and PAf is the acoustic power delivered into water from the transducer element.

DESCRIPTION OF THE PREFERRED EMBODIMENT

Various embodiments of the electro-acoustic transducer element in accordance with the present invention are shown in FIGS. 1A through 1G and FIGS. 2A through 2H, in which each transducer element includes a polymeric piezoelectric film 11. In the illustration, the bottom side of the polymer piezoelectric film 11 corresponds to the above-described acoustic emanation or front side.

As shown in FIGS. 1A through 1G, an additional layer 12, having a value of acoustic impedance (Z) not less than two times of a value of acoustic impedance ($Z_o$) of the polymeric piezoelectric film 11 and having a thickness of 0.5 $\mu$m through $3\lambda/8$, is provided directly or indirectly on the surface of the polymeric piezoelectric film 11 on the acoustic emanation side.

Figure 1A:
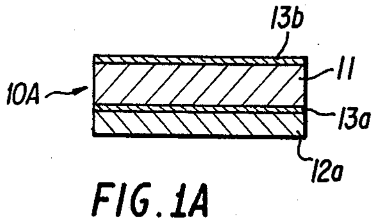
FIGS. 1A through 1G are sectional side views of various embodiments of an electro-acoustic transducer element having an additional layer on the acoustic emanation side in accordance with the present invention.

The transducer element 10A shown in FIG. 1A comprises a polymeric piezoelectric film 11, a rear electrode **13*b* fixed to the rear side surface of the film 11, another front electrode 13*a* fixed to the front side surface of the film 11, and a front additional layer 12*a* coupled to the film 11 via the front electrode 13*a***.

Figure 1B:
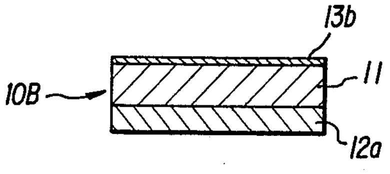

The transducer element 10B shown in FIG. 1B comprises a polymeric piezoelectric film 11, a rear electrode **13*b*, and a front additional layer 12*a* being made of an electro-conductive material fixed directly to the front side surface of the film 11. A front electrode 14*a*** such as shown in FIG. 1A is omitted in this example.

Figure 1C:
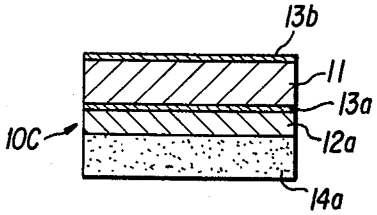

The transducer element 10C shown in FIG. 1C comprises a transducer element 10A as shown in FIG. 1A and a front second additional layer 14*a* being made of a polymeric material coupled to the front side surface of the transducer element 10A.

Figure 1D:
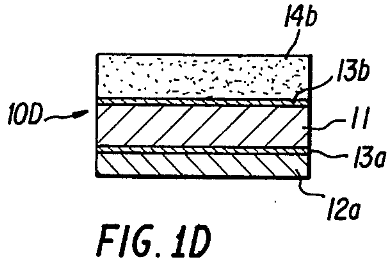

The transducer element 10D shown in FIG. 1D comprises a transducer element 10A as shown in FIG. 1A and a rear second additional layer 14*b* being made of a polymeric material coupled to the rear side surface of the transducer element 10A.

Figure 1E:
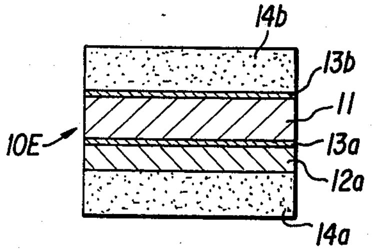

The transducer element 10E shown in FIG. 1E comprises a transducer element 10A as shown in FIG. 1A and front and rear second additional layer 14*a* and 14*b* being made of a polymeric material coupled respectively to the front and rear side surfaces of the transducer element 10A.

While not shown with figures, other transducer elements comprising a transducer element as shown in FIG. 1B and a second additional layer 14*a* and/or 14*b* is also possible.

Figure 1F:
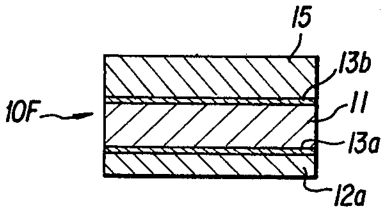

The transducer element 10F shown in FIG. 1F comprises a transducer element 10A as shown in FIG. 1A and a wave reflector plate 15 coupled to the rear side surface of the transducer element 10A.

While not shown with figures, other transducer elements comprising a combination of each transducer element mentioned above with FIGS. 1B through 1E and a wave reflector plate 15 is also possible.

Figure 1G:
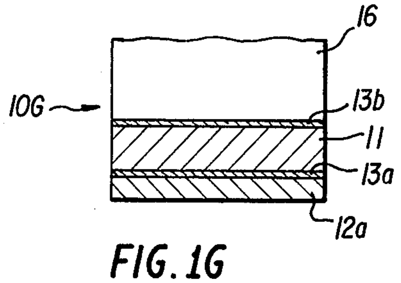

The transducer element 10G shown in FIG. 1G comprises a transducer element 10A as shown in FIG. 1A and a holder 16 coupled to the rear side surface of the transducer element 10A.

While not shown with figures, other transducer elements comprising a combination of each transducer element mentioned above with FIGS. 1B through 1F and a holder 16 is also possible.

As shown in FIGS. 2A through 2H, an additional layer 12, having a value of acoustic impedance (Z) being not less than two times a value of the acoustic impedance ($Z_0$) of the polymer piezoelectric film 11 and having a thickness of 0.5 μm up to 1λ/16, is provided directly, or indirectly on the surface of the polymeric piezoelectric film 11 at the side opposite to the acoustic emanation side.

Figure 2A:
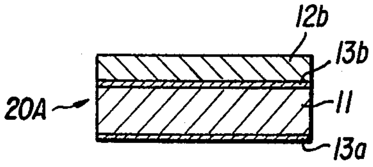
FIGS. 2A through 2H are sectional side views of various embodiments of an electro-acoustic transducer element having an additional layer on the side opposite to the acoustic emanation side in accordance with the present invention.

The transducer element 20A shown in FIG. 2A comprises a polymeric piezoelectric film 11, an rear electrode 13*b* fixed to the rear side surface of the film 11, another front electrode 13*a* fixed to the front side surface of the film 11, and a rear additional layer 12*b* coupled to the film 11 via the rear electrode 13*b*.

Figure 2B:
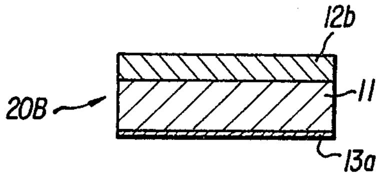

The transducer element 20B shown in FIG. 2B comprises a polymeric piezoelectric film 11, a front electrode 13*a*, and a rear additional layer 12*b* being made of an electroconductive material fixed directly to the rear side surface of the film 11. A rear side electrode 14*b* as shown in FIG. 2A is omitted in this example.

Figure 2C:
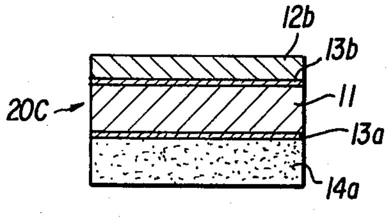

The transducer element 20C shown in FIG. 2C comprises a transducer element 20A as shown in FIG. 2A and a front second additional layer 14*a* being made of a polymeric material coupled to the front side surface of the transducer element 20A.

Figure 2D:
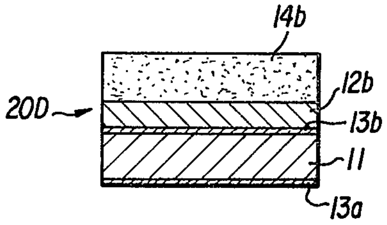

The transducer element 20D shown in FIG. 2D comprises a transducer element 20A as shown in FIG. 2A and a rear second additional layer 14*b* being made of a polymeric material coupled to the rear side surface of the transducer element 20A.

Figure 2E:
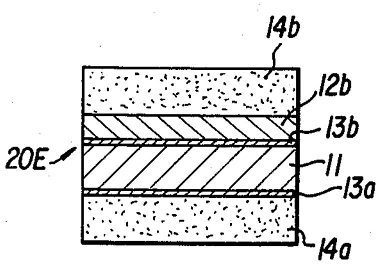

The transducer element 20E shown in FIG. 2E comprises a transducer element 20A as shown in FIG. 2A and front and rear second additional layer 14*a* and 14*b* being made of a polymeric material coupled respectively to the front and rear side surfaces of the transducer element 20A.

While not shown with figures, other transducer elements comprising a transducer element as shown in FIG. 2B and a second additional layer 14*a* and/or 14*b* is also possible.

Figure 2F:
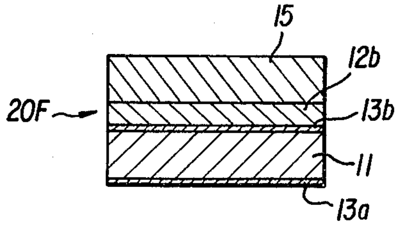
Figure 2G:
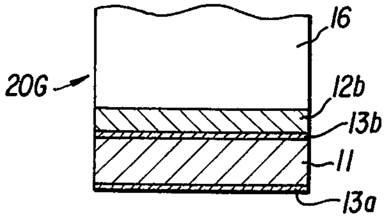
Figure 2H:
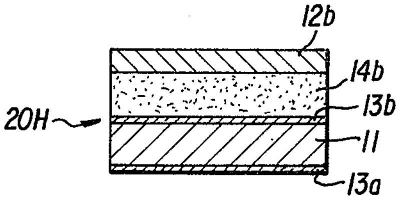

The transducer element 20H shown in FIG. 2H comprises a polymer piezoelectric film 11, a front electrode 13*a* fixed to the front side surface of the film 11, another rear electrode 13*b* fixed to the rear side surface of the film 11, a rear second additional layer 14*b* being made of a polymer material coupled to the rear electrode 13*b*, and a rear additional layer 12*b* coupled to the rear side surface of the second additional layer 14*b*.

The transducer element 20F shown in FIG. 2F comprises a transducer element 20A as shown in FIG. 2A and a wave reflector plate 15 coupled to the rear side surface of the transducer element 20A.

While not shown with figures, other transducer elements comprising a combination of each transducer element mentioned above with FIGS. 1B through 1E and 1H, and a wave reflector plate 15 is also possible.

The transducer element 20G shown in FIG. 2G comprises a transducer element 20A as shown in FIG. 2A and a holder 16 coupled to the rear side surface of the transducer element 20A.

While not shown with figures, other transducer elements comprising a combination of each transducer element mentioned above with FIGS. 2B through 2F and 2H, and a holder 16 is also possible.

The second additional layer mentioned above is made of a polymeric material in which a ration of the value of acoustic impedance ($Z_P$) of the material to a value of acoustic impedance ($Z_o$) of the polymer piezoelectric film is in the range of from 0.2 to 2, preferably from 0.3 to 2, more preferably from 0.5 to 2. The polymeric material forming the second additional layer is preferably chosen from a group consisting of polyethylene terephthalate, polycarbonate, PMMA, polystyrene, ABS, polyethylene, polyvinyl chloride, polyimide, polyamide, aromatic polyamide and polyvinylidene fluoride.

The reflector plate 15 mentioned above is made of a material whose acoustic impedance is by far larger than those of polymeric piezoelectric film 11 and the holder 16. Metals such as Au, Cu and W are in general advantageously usable for this purpose.

The holder 16 mentioned above is made of any kind of material, when the holder 16 is positioned on the polymer piezoelectric film 11 via the rear second additional layer 14*b* such as shown in FIGS. 1D and 1E, and FIGS. 2D and 2E, the holder 16 is preferably made of a material having small acoustic impedance such as a polymeric material. Such polymeric material is preferably chosen from the group consisting of PMMA, polystyrene, ABS, bakelite and epoxy resin.

EXAMPLES

Examples 1–4 and comparative examples 1–2

Figure 3A:
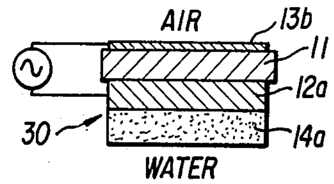
FIG. 3A is schematic view of one embodiment of the electro-acoustic transducer element in accordance with the present invention.

The construction of the transducer element used in this group is shown with FIG. 3A. The transducer element 30 shown in FIG. 3A comprises a polymeric piezoelectric film 11, a rear electrode 13*b* coupled to the rear side surface of the film 11, a front additional layer 12*a* coupled to the front side surface of the film 11, and a second additional layer 14*a* coupled to the front side surface of the front additional layer 12*a*. The polymeric piezoelectric film 11 is formed with a piezoelectric polyvinylidene fluoride film having the thickness of 76 μm. The rear electrode 13b is formed by a layer of Al evaporated on the surface of the film 11 with the thickness of 0.1 μm. The front additional layer 12a having a surface area of 1.25 $cm^2$ is provided by a coating paste of Ag. The front second additional layer 14a bonded to the front additional layer 12a is made of a polyethylene terephthalate film having the thickness of 25 μm. Five kinds of transducer elements are prepared by chosing the thickness of the additional layer at 5, 10, 20, 40 and 100 μm in the above mentioned transducer element 30. Another transducer element omits the front additional layer 12a and is provided with a thin layer electrode instead of the omitted front additional layer 12a on the transducer element 30 shown in FIG. 3A. The thickness of the additional layer 5, 10, 20, 40 and 100 μm are nearly equal to 1λ/40, 1λ/20, 1λ/10, 1λ/5 and 1λ/2 respectively on these examples. Therefore, the transducer elements having the additional layer of 5, 10, 20 and 40 μm in thickness are in the scope of the present invention, and the transducer elements having no additional layer and having the additional layer of 100 μm in thickness are outside of the scope of the present invention. Here, for the sonic velocity in the additional layer made of Ag, the value of 3,000 m/sec was used, and for the density of the additional layer made of Ag, the value of 5.0 gr/$cm^3$ was used.

The six transducer elements were subjected to evaluation of frequency characteristics. The results are shown in FIG. 3B, in which frequency in MHz is shown on the abscissa and conversion loss (TLf) in dB on the ordinate.

The solid line curves are for the examples in accordance with the present invention and the dotted line curves for the comparative examples.

Figure 3B:
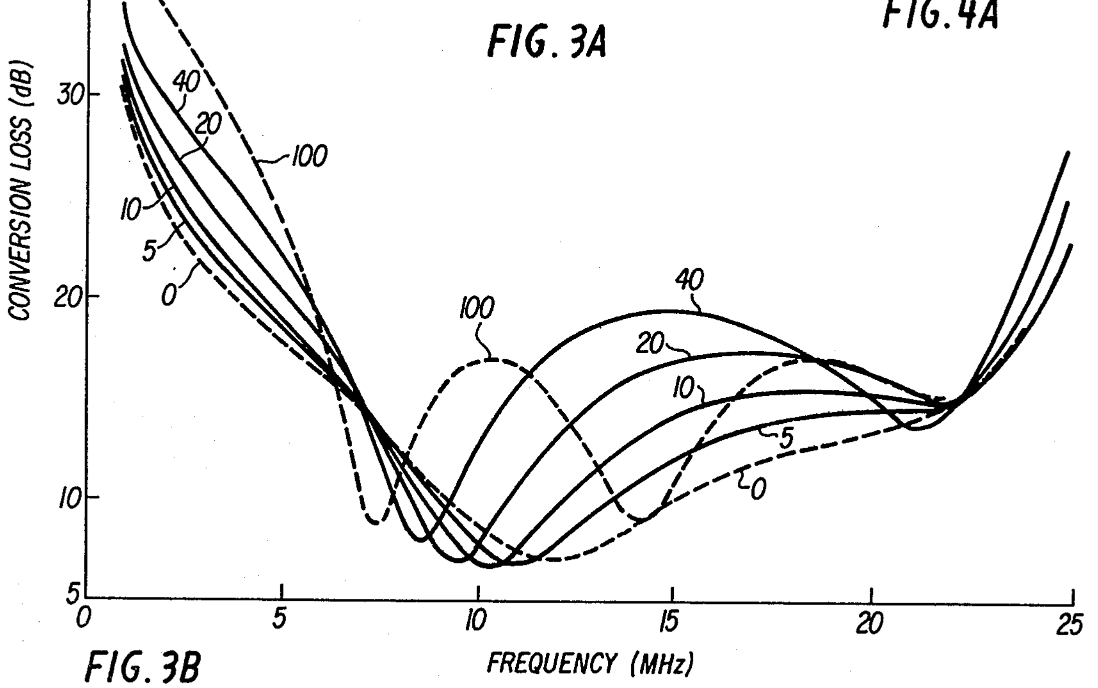
FIG. 3B is a graph for showing the relationship between the frequency of the ultrasonic wave used for the arrangement shown in FIG. 3A and its conversion loss.

It is clear from FIG. 3B that the transducer element having an additional layer defined in the present invention has its minimum conversion loss at a lower frequency than in the case of the transducer element having no additional layer, although both of the transducer elements have the same polymeric piezoelectric film in thickness. This means that an ultrasonic transducer having its resonant frequency in the range of a lower frequency which is preferably used for diagnostics can be produced with thin polymeric piezoelectric, the same easily obtained by a general polarization and without the need for a thick polymer piezoelectric film which is hard to be obtained by ordinary polarization.

On the other hand, when the thickness of the additional layer becomes thick beyond the limitation defined in the present invention, the resonant frequency goes to a lower frequency, but the band of the frequency becomes sharply narrow. This means such a transducer element has low utility in analysis and has a problem in practical use in diagnostics.

Examples 5–9 and comparative example 3

Figure 4A:
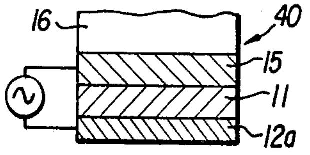
FIG. 4A is a schematic side view of another electro-acoustic transducer element in accordance with the present invention.

The construction of the transducer element used in this group is shown in FIG. 4A. The transducer element 40 shown in FIG. 4A comprises a polymer piezoelectric film 11, a reflector plate 15 coupled to the rear side surface of the film 11, a holder 16 coupled to the rear side surface of the reflector plate 15, and a front additional layer 12a coupled to the front side of the film 11. The polymer piezoelectric film 11 is formed by a piezoelectric polyvinylidene fluoride film having the thickness of 76 μm. The reflector plate 15 is formed by a Cu plate having the thickness of 100 μm bonded to the surface of the film 11. The holder 16 is formed by PMMA bonded to the surface of the reflector plate 15. The front additional layer 12a is formed by Cu sheet having a thickness of 100 μm bonded to the surface of the film 11. Five kinds of transducer elements were prepared by chosing the thickness of the front additional layer 12a at 5, 10, 20, 40 and 60 μm in the above mentioned transducer element 30. Another transducer element omitted the front additional layer 12a and was provided with a thin layer electrode instead of the omitted additional layer 12 on the transducer element 30 shown in FIG. 4A.

Figure 4B:
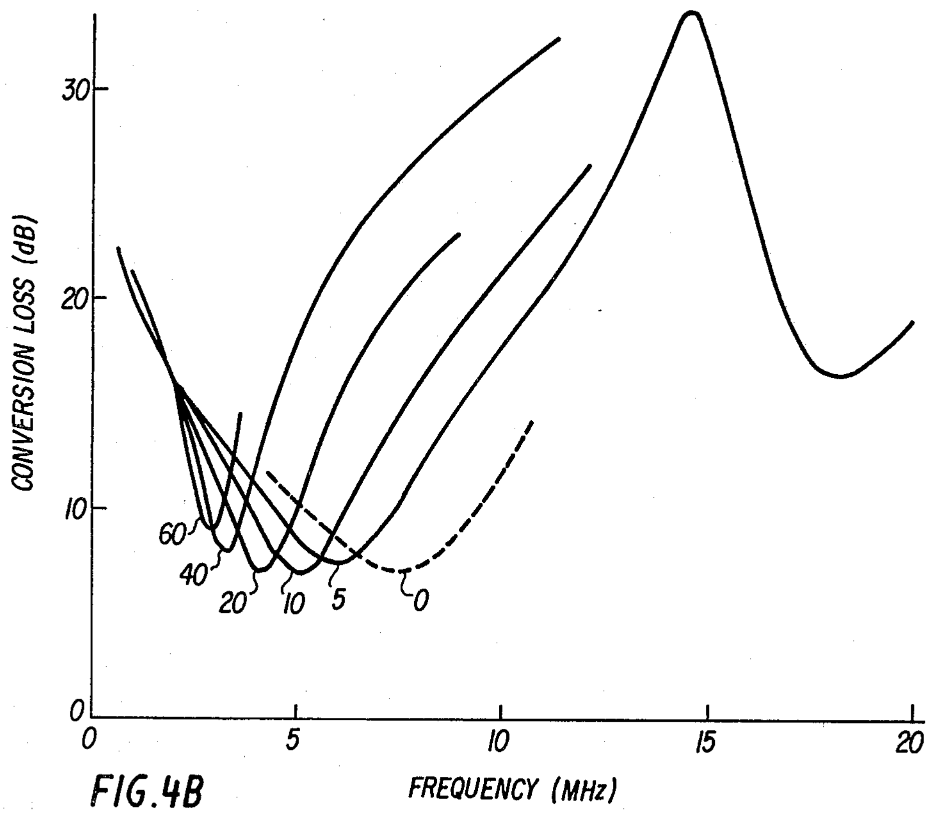
FIG. 4B is a graph for showing the relationship between the frequency of the ultrasonic wave used for the arrangement shown in FIG. 4A and its conversion loss.

The six transducer elements were subjected to evaluation of frequency characteristics. The results are shown in FIG. 4B, in which frequency in MHz is shown on the abscissa and conversion loss (TLf) in dB on the ordinate.

The solid line curves are for the examples in accordance with the present invention and the dotted line curve is for the comparative example.

Examples 10–12

Figure 5A:
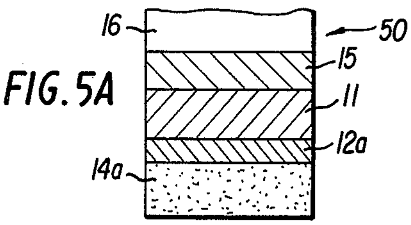
FIG. 5A is a schematic side view of another electro-acoustic transducer element in accordance with the present invention.

The construction of the transducer element used in this group is shown with FIG. 5A. The transducer element 50 shown in FIG. 5A is basically the same in construction as that disclosed in FIG. 4A except that a front second additional layer 14a is provided at the front side surface of the front additional layer 12a. The front second additional layer 14a is made of polyethylene terephthalate having the thickness of 25 μm bonded to the surface of the front additional layer 12a. Three kinds of transducer elements are prepared by chosing the thickness of the front additional layer 12a at 5, 10 and 20 μm in the above mentioned transducer element 50.

The three transducer elements were subjected to evaluation of frequency characteristics. The results are shown in FIG. 5B, in which frequency in MHz is shown on the abscissa and conversion loss (TLf) in dB on the ordinate.

The three solid line curves are for the examples in accordance with the present invention.

Figure 5B:
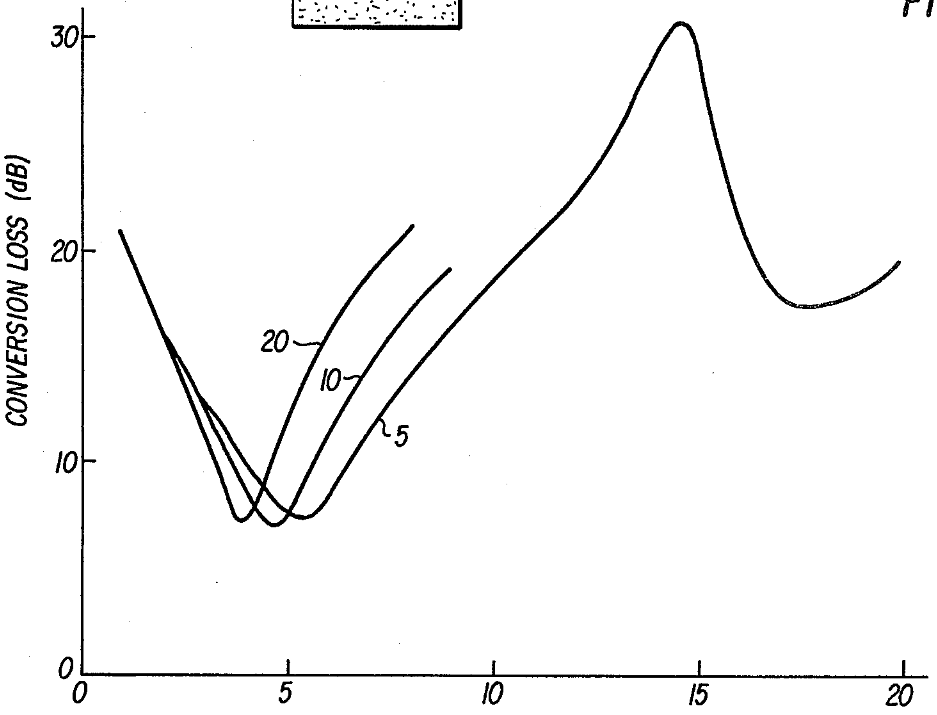
FIG. 5B is a graph for showing the relationship between the frequency of the ultrasonic wave used for the arrangement shown in FIG. 5A and its conversion loss.

Comparing FIG. 4B with FIG. 5B shows that the second additional layer has the effect of making the position of minimum conversion loss at a further lower frequency.

Examples 13–15 and comparative example 4

Figure 6A:
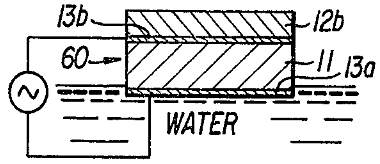
FIG. 6A is a schematic side view of a further electro-acoustic transducer element in accordance with the present invention.

The construction of the transducer element used in this group is shown with FIG. 6A. The transducer element 60 shown in FIG. 6A comprises a polymeric piezoelectric film 11, a rear electrode 13b coupled to the rear side surface of the film 11, an additional layer 12 coupled to the rearside surface of the rear electrode 13b, and a front electrode 13a coupled to the front side surface of the film 11. The polymeric piezoelectric film 11 is formed by a piezoelectric polyvinylidene fluoride film having the thickness of 76 μm. Both the rear and front electrodes 13a and 13b are formed by a layer of Al evaporated on both surfaces of the film 11 with the thickness of 0.1 μm. The rear additional layer 12b is formed with a Cu sheet bonded to the surface of the film 11. Three kinds of transducer elements are prepared by chosing the thickness of the rear additional layer 12b as 1, 5 and 20 μm in the above mentioned transducer element 60. The thickness of 1, 5 and 20 μm are nearly equal to 1λ/340, 1λ/68 and 1λ/17 respectively on these examples. Another transducer element omitted the rear additional layer 12b in the transducer element 60 is prepared.

Figure 6B:
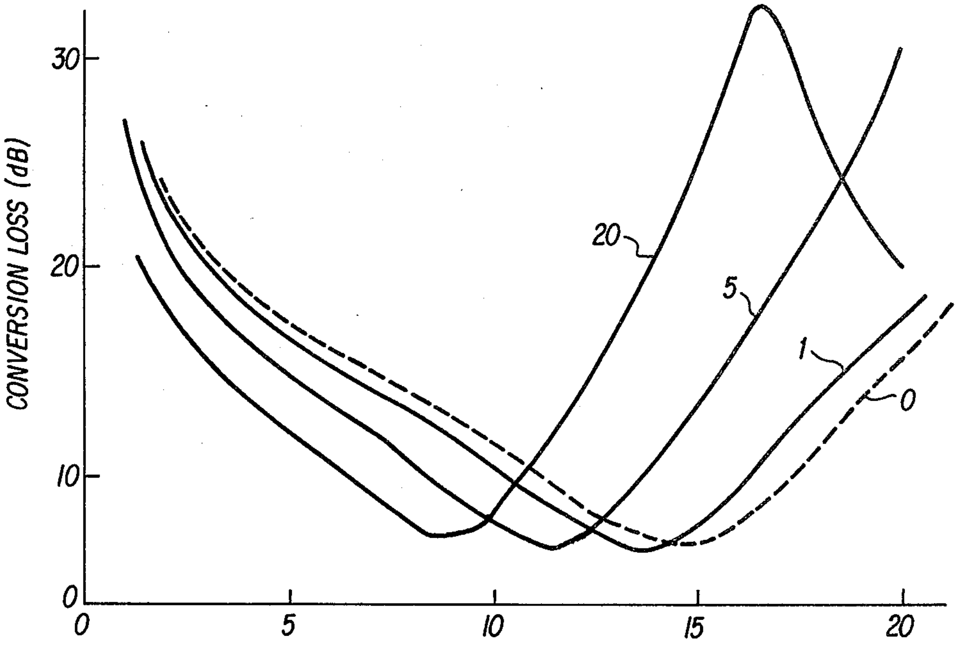
FIG. 6B is a graph for showing the relationship between the frequency of the ultrasonic wave used for the arrangement shown in FIG. 6A and its conversion loss.

The four transducer elements were subjected to evaluation of frequency characteristics. The results are shown in FIG. 6B, in which frequency in MHz is shown on the abscissa and conversion loss (TLf) in dB on the ordinate.

The solid line curves are for the examples in accordance with the present invention and the dotted line curve is for the comparative example.

Examples 16–17 and comparative example 5

Figure 7A:
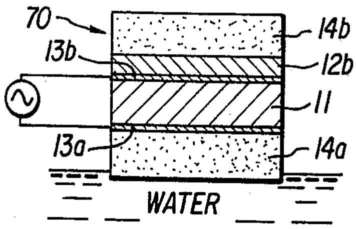
FIG. 7A is a schematic side view of a still further electro-acoustic transducer element in accordance with the present invention.

The construction of the transducer element used in this group is shown with FIG. 7A. The transducer element 70 shown in FIG. 7A comprises a polymeric piezoelectric film 11, a rear electrode 13b coupled to the rear side surface of the film 11, a rear additional layer 12b coupled to the rear side surface of the rear electrode 13b, a rear second additional layer 14b coupled to the rear side surface of the rear additional layer 12b, a front electrode 13a coupled to the front side surface of the film 11, and a front second additional layer 14a coupled to the front side surface of the front electrode 13a. The polymeric piezoelectric film 11 is formed by a piezoelectric polyvinylidene fluroide film having the thickness of 76 μm. The both rear and front electrodes 13a and 13b are formed by layers of Al evaporated on the both surfaces of the film 11 with the thickness of 0.1 μm. The rear additional layer 12b is formed by a Cu sheet bonded to the surface of the rear electrode 13b. The both the rear and front second additional layers 14a and 14b are formed by polyethylene terephthalate plates having a thickness of 25 μm bonded to the surface of the rear additional layer 12b and to the surface of the front electrode 13a. Two kinds of transducer elements are prepared by chosing the thickness of the additional layer at 5 and 20 μm in the above mentioned transducer element 70. The thickness of 5 and 20 μm are nearly equal to 1λ/68 and 1λ/17 respectively on these examples. Another transducer element omitting rear additional layer 12b in the transducer element 70 is prepared.

Figure 7B:
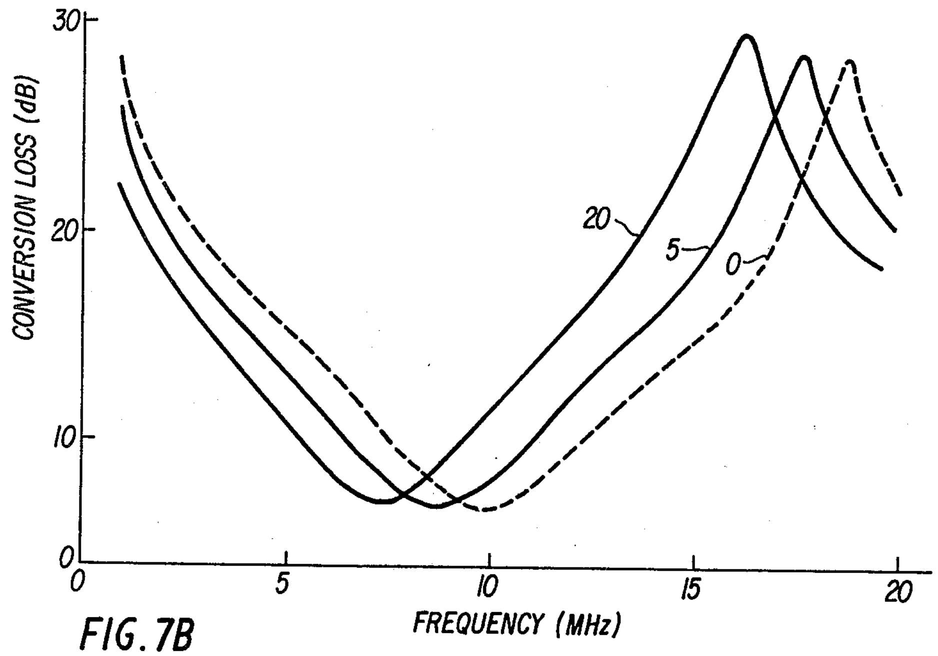
FIG. 7B is a graph for showing the relationship between the frequency of the ultrasonic wave used for the arrangement shown in FIG. 7A and its conversion loss.

The three transducer elements were subjected to evaluation of frequency characteristics. The results are shown in FIG. 7B, in which frequency in MHz is shown on the abscissa and conversion loss (TLf) in dB on the ordinate.

The solid line waves are for the examples in accordance with the present invention and the dotted line curve is for the comparative example.

Examples 18–20

Figure 8A:
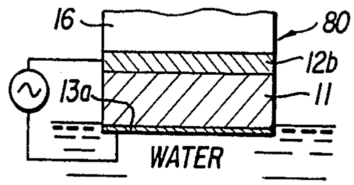
FIG. 8A is a schematic side view of a still further electro-acoustic transducer element in accordance with the present invention.

The construction of the transducer element used in this group is shown with FIG. 8A. The transducer element 80 shown in FIG. 8A comprises a polymeric piezoelectric film 11, a rear additional layer 12b coupled to the rear side surface of the film 11, a holder 16 coupled to the rear side surface of the rear additional layer 12b, and a front electrode 13a coupled to the front side surface of the film 11. The polymeric piezoelectric film 11 is formed with a piezoelectric polyvinylidene fluoride film having the thickness of 76 μm. The front electrode 13a is formed by layer of Al evaporated on the surface of the film 11 with the thickness of 0.1 μm. The rear additional layer 12a is formed by a Cu sheet bonded to the rear side surface of the film 11. The holder 16 is formed with PMMA. Three kinds of transducer elements are prepared by chosing the thickness of the additional layer at 0.5, 5 and 20 μm in the above mentioned transducer element 80. The thickness of 0.5, 5 and 20 μm are nearly equal to 1λ/680, 1λ/68 and 1λ/17 respectively on these examples.

Figure 8B:
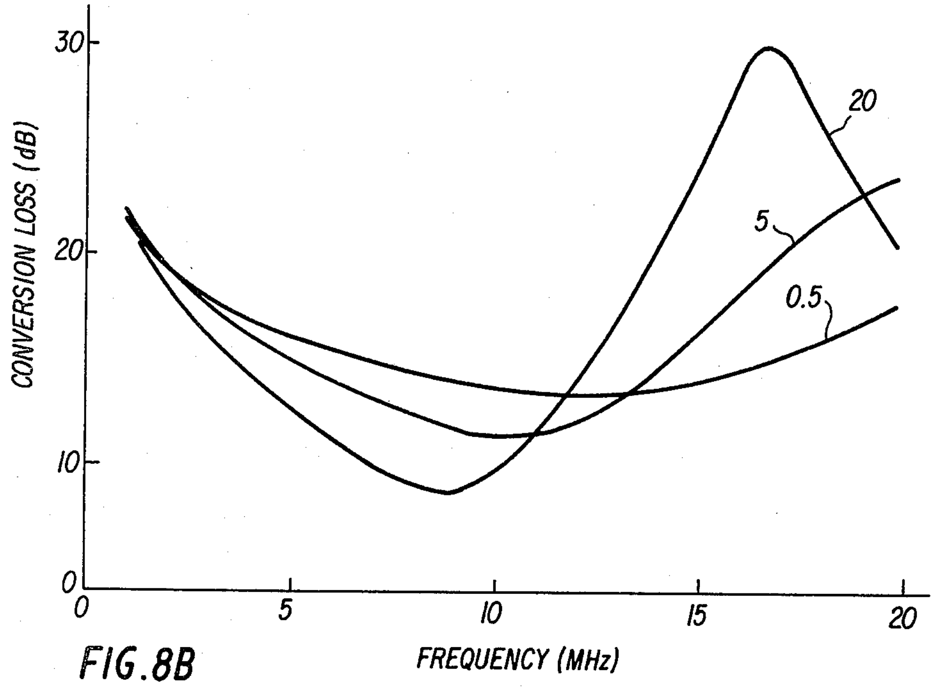
FIG. 8B is a graph for showing the relationship between the frequency of the ultrasonic wave used for the arrangement shown in FIG. 8A and its conversion loss.

The three transducer elements were subjected to an evaluation of frequency characteristics. The results are shown in FIG. 8B, in which frequency in MHz is shown on the abscissa and conversion loss (TLf) in dB on the ordinate.

The solid line curves are for the examples in accordance with the present invention.

As shown with some practical examples, according to the present invention, an electro-acoustic transducer element is obtained having its resonant frequency lower in frequency as compared with a transducer element without an additional layer such as defined in the present invention yet without narrowing the band width. This means that an electro-acoustic transducer element having its resonant frequency lower in frequency can be obtained with a thin polymeric piezoelectric film which is easy to polarize and acts with low electric capacity, and without a thick polymer film which is not easy to polarize and acts with high electric capacity.

We claim:

1. An improved electro-acoustic transducer element comprising a polymeric piezoelectric film having an acoustic impedance $Z_o$, elements functioning as electrodes for the film, an additional layer having an acoustic impedance Z coupled to the acoustic emanation side of the film and having a thickness of from 0.5 μm to 3λ/8 in which λ refers to the wavelength of sound waves within the additional layer at the free resonant frequency of the film, and the acoustic impedance Z of the additional layer being not less than two times the acoustic impedance $Z_o$ of the film.

2. An improved electro-acoustic transducer element comprising a polymeric piezoelectric film having acoustic impedance $Z_o$, elements functioning as electrodes for the film, an additional comparatively thin layer having an acoustic impedance Z coupled to the side opposite to the acoustic emanation side of the film and having a thickness less than the film and of from 0.5 μm to 1λ/16 in which λ refers to the wavelength of sound waves in the additional layer at the free resonant frequency of the film, and the acoustic impedance Z of the additional layer being not less than two times the acoustic impedance $Z_o$ of the film.

3. An improved electro-acoustic transducer element as claimed in claim 1 or 2, in which said additional layer is made of metal.

4. An improved electro-acoustic transducer element as claimed in claim 3 in which said additional layer functions as one of said electrode elements as well as functioning as said additional layer.

5. An improved electro-acoustic transducer element as claimed in claim 3 in which said metal forming said additional layer is chosen from a group consisting of Al, Cu, Ag, Sn, Au, Pb, Ni, Ti, Cr, Fe, Zn, In, Mo, and alloys whose constituents include at least one metal of said group.

6. An improved electro-acoustic transducer element as claimed in claim 1 or 2, in which said film is made of a material chosen from a group consisting of polyvinylidene fluoride, copolymers of polyvinylidene fluoride, polyvinyl chloride, acrylonitrile polymers, and polymers including powdered ferroelectric ceramic.

7. An improved electro-acoustic transducer element as claimed in claim 1 or 2, further comprising a second additional layer which is made of polymeric material coupled to said electro-acoustic transducer element.

8. An improved electro-acoustic transducer element as claimed in claim 7 in which the acoustic impedance $Z_p$ of said second additional layer is related to said acoustic impedance $Z_o$ of said film as follows:

$$0.2 < Z_p/Z_o < 2.$$

9. An improved electro-acoustic transducer element as claimed in claim 8 in which said second additional layer is made of a material chosen from a group consisting of polyethylene terephthalate, polycarbonate, PMMA, polystyrene, ABS, polyethylene, polyvinyl chloride, polyimide, polyamide, aromatic polyamide, and polyvinylidene fluoride.

10. An improved electro-acoustic transducer element as claimed in claim 1 or 2, further comprising a reflector plate which is made of metal coupled to said electro-acoustic transducer element.

11. An improved electro-acoustic transducer element as claimed in claim 10 in which said reflector plate is made of a material chosen from a group consisting of Au, Cu, and W.

12. An improved electro-acoustic transducer element as claimed in claim 1 or 2, further comprising a holder coupled to said electro-acoustic transducer element.

13. An improved electro-acoustic transducer element as claimed in claim 12 in which said holder is made of a polymer.

14. An improved electro-acoustic transducer element as claimed in claim 13 in which said polymer is chosen from a group consisting of PMMA, polystyrene, ABS, bakelite, and epoxy resin.

* * * * *